(12) United States Patent
Miklosi

(10) Patent No.: US 10,917,977 B2
(45) Date of Patent: Feb. 9, 2021

(54) CONNECTOR FOR JOINING TWO HOUSING PARTS, AND A HOUSING INCLUDING TWO HOUSING PARTS AND AT LEAST ONE CONNECTOR

(71) Applicant: Robert Bosch GmbH, Stuttgart (DE)

(72) Inventor: Zoltan Miklosi, Budapest (HU)

(73) Assignee: Robert Bosch GmbH, Stuttgart (DE)

(*) Notice: Subject to any disclaimer, the term of this patent is extended or adjusted under 35 U.S.C. 154(b) by 0 days.

(21) Appl. No.: 16/492,988

(22) PCT Filed: Feb. 15, 2018

(86) PCT No.: PCT/EP2018/053823
§ 371 (c)(1),
(2) Date: Sep. 11, 2019

(87) PCT Pub. No.: WO2018/171985
PCT Pub. Date: Sep. 27, 2018

(65) Prior Publication Data
US 2020/0068723 A1 Feb. 27, 2020

(30) Foreign Application Priority Data
Mar. 20, 2017 (DE) .......................... 10 2017 204 600

(51) Int. Cl.
*H05K 5/00* (2006.01)
*E05C 19/06* (2006.01)
(Continued)

(52) U.S. Cl.
CPC ........... *H05K 5/0013* (2013.01); *E05C 19/06* (2013.01); *F16B 5/0635* (2013.01); *F16B 5/0664* (2013.01); *H05K 5/0221* (2013.01)

(58) Field of Classification Search
CPC .... H05K 5/0013; H05K 5/0221; E05C 19/06; F16B 5/0635; F16B 5/0664
See application file for complete search history.

(56) References Cited

U.S. PATENT DOCUMENTS 5,332,866 A * 7/1994 Sawamura ........... H02G 3/0608
138/166
5,577,779 A * 11/1996 Dangel .................. E05O 19/06
220/326
(Continued)

FOREIGN PATENT DOCUMENTS

DE 19642045 A1 4/1998
DE 69902828 T2 1/2003
(Continued)

OTHER PUBLICATIONS

International Search Report for PCT/EP2018/053823, dated Apr. 13, 2016.

*Primary Examiner* — Hahn V Tran
(74) *Attorney, Agent, or Firm* — Norton Rose Fulbright US LLP; Gerard Messina

(57) ABSTRACT

A connector for joining two housing parts. A first connector part is formed to be situated on a first housing part. A second connector part is formed to be situated on a second housing part. The first connector part includes at least one spring element, a first snap-on element, and a second snap-on element. The second connector part has a first and second catch element). The first catch element and the first snap-on element are interconnected in a form-locked and force-locked manner, supported by a restoring force of the at least one spring element. The second snap-on element and the second catch element are shaped in such a manner, that in response to a movement of the first connector part and the second connector part apart from each other, a form-locked connection is formed, which prevents the second snap-on element from sliding back over the second catch element.

9 Claims, 3 Drawing Sheets

(51) Int. Cl.
*H05K 5/02* (2006.01)
*F16B 5/06* (2006.01)

(56) References Cited

U.S. PATENT DOCUMENTS

| | | | | |
|---|---|---|---|---|
| 5,665,304 | A * | 9/1997 | Heinen | A47F 1/126 108/110 |
| 6,054,650 | A * | 4/2000 | Schindler | H05K 9/0016 174/50 |
| 6,375,283 | B1 * | 4/2002 | Kitamura | H04B 1/3833 292/81 |
| 6,457,788 | B1 * | 10/2002 | Perez | G06F 1/181 297/80 |
| 6,532,193 | B1 * | 3/2003 | Fehse | G10K 9/122 310/338 |
| 7,486,506 | B2 * | 2/2009 | Chen | G06F 1/181 312/223.2 |
| 8,226,178 | B2 * | 7/2012 | Kummel | F25D 23/126 312/204 |
| 8,480,186 | B2 * | 7/2013 | Wang | H05K 5/0013 312/223.1 |
| 10,196,016 | B2 * | 2/2019 | Ujita | H02G 3/0406 |
| 10,561,031 | B2 * | 2/2020 | Uchida | H05K 5/0034 |
| 2005/0225449 | A1 | 10/2005 | Blakeway | |
| 2006/0088377 | A1 * | 4/2006 | Rejman | B25F 5/02 403/331 |
| 2007/0097330 | A1 * | 5/2007 | Park | G06F 1/1601 353/79 |
| 2008/0165485 | A1 * | 7/2008 | Zadesky | H05K 5/0013 361/679.02 |
| 2012/0187812 | A1 | 7/2012 | Gerst | |
| 2014/0254192 | A1 * | 9/2014 | Do | G02F 1/133308 362/606 |
| 2015/0208523 | A1 * | 7/2015 | Lee | H05K 5/02 361/679.01 |
| 2018/0239006 | A1 * | 8/2018 | Kupfernagel | G01S 7/521 |

FOREIGN PATENT DOCUMENTS

| | | |
|---|---|---|
| DE | 102007059944 A1 | 1/2009 |
| EP | 1765047 A2 | 3/2007 |
| JP | H08228418 A | 9/1996 |
| JP | H09430 U | 8/1997 |
| JP | 2000123912 A | 4/2000 |
| JP | 2001351747 A | 12/2001 |
| JP | 2007095407 A | 4/2007 |

\* cited by examiner

CONNECTOR FOR JOINING TWO HOUSING PARTS, AND A HOUSING INCLUDING TWO HOUSING PARTS AND AT LEAST ONE CONNECTOR

BACKGROUND INFORMATION

The present invention relates to a connector for joining two housing parts; a first connector part being formed to be situated on a first housing part, and a second connector part being formed to be situated on a second housing part; the first connector part including at least one spring element and a first snap-on element, and the second connector part including a first catch element; in response to the first housing part's and the second housing part's being joined, the first snap-on element being configured to interact with the catch element in such a manner, that upon joining the housing parts, the first connector part and the second connector part are moved towards each other along a joining direction, the snap-on element is slid over the first catch element amid deflection of the at least one spring element, and the catch element and the snap-on element subsequently produce a form-locked connection. Further aspects of the present invention relate to a housing including at least one such connector, as well as to an ultrasonic sensor including such a housing.

Housings, for example, for electronic devices or for sensors, have, generally, at least two housing parts. In the case of a housing for a sensor, the housing has the task of accommodating the transducer element and the electronics necessary for controlling the transducer and protecting them from environmental influences. If the housing is made up of two separate parts, for example, then, the components of the electronic device or of the sensor may initially be positioned in one half of the housing, and the housing may subsequently be closed by joining it to the second half of the housing. For rapid, simple and inexpensive joining of two halves of a housing, connection systems are known from the related art, where, in each instance, two elements are joined to each other, using, for example, a detent hook or a snap-on element.

A housing having a locking structure for joining a first housing part to a second housing part is described in U.S. Patent Application Publication No. 2012/0187812 A1. The locking structure includes a flexible snap-on element, which extends from the first housing part, along the inner wall of the second housing part, and is provided with a first interacting part. A second interacting part, which produces a form-locked connection with the first interacting part of the snap-on element, is situated on the second housing part. The second interacting part includes a ramp, over which the snap-on element may slide during assembly. The snap-on element has two legs; in the locked state, the second interacting part being situated between the two legs.

A disadvantage of the conventional connecting elements is that in the case of the use of a form-locked connection, this normally has play, which means that the housing parts joined by the connectors have this play, as well. The consequence of this is that the housing rattles in response to vibrations. Connectors, which are used as an alternative to them and are based on a form-locked connection, have the disadvantage that the connection between the housing parts may be released again when the retention force is exceeded. Therefore, there is a need for a connector, by which two housing parts may be joined to each other securely and permanently and the connection does not have any play.

SUMMARY

In accordance with an example embodiment of the present invention, a connector for joining two housing parts is provided, where a first connector part is formed to be situated on a first housing part, and a second connector part is formed to be situated on a second housing part. The first connector part includes at least one spring element and a first snap-on element, and the second connector part includes a first catch element. The at least one spring element has a base for connecting to the first housing part. In the case of joining the first housing part and the second housing part, the first snap-on element is configured to interact with the first catch element in such a manner, that when the first connector part and the second connector part are moved towards each other along a joining direction, the first snap-on element is slid over the first catch element amid deflection of the at least one spring element; the first catch element and the first snap-on element subsequently being joined in a form-locked and force-locked manner, supported by a restoring force of the at least one spring element. The first connector part additionally includes a second snap-on element, and the second connector part additionally includes a second catch element. The second snap-on element and the second catch element are shaped in such a manner, that in response to the first connector part's and the second connector part's moving towards each other along the joining direction, the second snap-on element is slid over the second catch element amid deflection of the at least one spring element; the second catch element and the second snap-on element being shaped in such a manner, that in response to the first connector part's and the second connector part's moving apart from each other in a direction opposite to the joining direction, a form-locked connection is formed, which prevents the second snap-on element from sliding back over the second catch element.

The first connector part is preferably made of a plastic material; the first connector part preferably being manufactured in one piece, so that the at least one spring element, as well as the first snap-on element and the second snap-on element, form a single component part. If the first housing part is also made of a plastic, it is also preferable for the first connector part to be manufactured in one piece with the first housing part.

The second connector part, including the first catch element and the second catch element, is preferably manufactured in one piece with the second housing part. A plastic material is likewise suitable as a material for the second connector part. In this context, the plastic material may be selected to be identical to the plastic material of the first connector part, or a different plastic material may be selected. In addition, it is conceivable for the second connector part to be made of a metal.

Preferred plastic materials for the first connector part and/or the second connector part include, in particular, thermoplastic materials. The plastic may additionally be reinforced with fibers, such as glass fibers. Examples of suitable plastics include polybutylene terephthalate (PBT) and polyamide reinforced with fiber glass.

The side of the first catch element pointing in the direction of the base of the first connector part preferably has a first ramp shape with reference to the joining direction, and/or the side of the second catch element pointing in the direction of the base of the first connector part has a second ramp shape with reference to the joining direction, which means that during a movement along the joining direction, the first snap-on element slides along on the first ramp shape and the second snap-on element slides along on the second ramp shape; the at least one spring element being deflected.

In this context, the second connector part is preferably situated in the region of a wall of the second housing part; the first catch element and/or the second catch element abutting this housing wall. In this context, the first ramp shape of the first catch element and/or the second ramp shape of the second catch element is constructed in such a manner, that the housing wall forms a plane, on which the first catch element and the second catch element are situated, and the ramp shape is situated on this plane in such a manner, that the ramp shape falls in the direction of the base of the first connector part and, at its end, preferably transitions into the plane formed by the housing part, without a jump or a step.

The first catch element preferably has a third ramp shape on the side facing away from the base of the first connector part; the first snap-on element having a shape complementary to it. In this manner, it is ensured that due to the restoring force of the at least one spring element, the complementary shape of the first snap-on element is connected in a force-locked manner to the third ramp shape of the catch element situated on the opposite side, so that play between the first connector part and the second connector part is prevented. In this manner, for example, the two housing parts are prevented from being able to rattle in response to vibration.

The second catch element preferably has a surface perpendicular to the joining direction, on the side facing away from the base of the first connector part, or the second catch element has an undercut on the side facing away from the base of the first connector part, with reference to a direction perpendicular to the joining direction. To that end, it is preferable for the second snap-on element to include a tip, which has a shape complementary to the shape of the side of the second catch element facing away from the base of the first connector part. This tip points in the direction of the base. In the event of a relative movement of the first connector part with respect to the second connector part, in a direction opposite to the joining direction, this allows the second catch element and the second snap-on element to produce a form-locked connection, which prevents an evading movement, so that the second snap-on element may not slide over the second catch element.

The at least one spring element preferably takes the form of a bending beam. In addition, it is preferable for the first connector part to have two spring elements, which each take the form of a bending beam; the first snap-on element connecting the two spring elements, so that a U-shaped configuration is formed. In this U-shaped configuration, the two spring elements form the legs of the U-shape.

The spring elements shaped as bending beams are preferably mounted in such a manner, that they are positioned parallelly to the joining direction and are deflected in a direction perpendicular to the joining direction during the joining of the first connector element to the second connector element.

The second snap-on element is preferably connected to the first snap-on element in such a manner, that the two spring elements, the first snap-on element and the second snap-on element produce an E-shaped configuration. In this context, the two spring elements form the uppermost and the lowest crossbars of the E, respectively, the second snap-on element forms the middle crossbar of the E-shape, and the first snap-on element connects the crossbars in the E-shape to each other.

The first catch element of the second connector part is preferably shaped in such a manner, that it includes an opening, with which the second snap-on element may engage.

Due to the opening in the first catch element and, optionally, the further design of the first catch element, then, during the interaction with the first connector part, in particular, with the spring elements and the first snap-on element, in addition to the force-locked connection between the first snap-on element and the first catch element, a form-locked connection may also be produced.

A further aspect of the present invention is to provide a housing, which includes a first housing part and a second housing part. The housing additionally includes at least one of the connectors described above; a first connector part being situated on the first housing part, and a second connector part being situated on the second housing part.

The housing preferably takes the form of a sensor housing. In particular, the sensor housing may be configured as a sensor housing for an ultrasonic sensor and accommodate, in addition to a sound transducer, electronics for controlling the sound transducer, as well.

A further aspect of the present invention is to provide an ultrasonic sensor, which has one of the housings described above. Furthermore, the ultrasonic sensor includes a sound transducer and electronics for controlling the sound transducer.

The proposed connector for joining two housing parts has two interacting lock mechanisms. In this context, a first lock mechanism, which is formed by a first snap-on element and a first catch element, produces a combined force-locked connection and form-locked connection; rattling of the housing in response to the action of vibrations being advantageously prevented by the force-locked connection. In this instance, the force-locked connection prevents a movement of the two housing parts relative to each other, as long as the occurring forces are less than the retention force of the force-locked connection.

For the case in which the occurring forces exceed the retention force of the force-locked connection, the second lock mechanism provided prevents the two housing parts from separating. The second lock mechanism includes the second snap-on element and the second catch element. If forces, which exceed the retention force of the force-locked connection of the first lock mechanism, act upon the connector, then the two connector parts start to move apart from each other. In so doing, however, a tip of the second snap-on element strikes a corresponding, complementary shape of the second catch element, through which a form-locked connection preventing a further movement is produced.

Consequently, separation of the two housing parts is prevented by the second lock mechanism of the proposed connector; the first lock mechanism simultaneously preventing the two housing parts from rattling in response to the action of a vibration. In this context, the first lock mechanism allows manufacturing tolerances and changes in the dimensions due to temperature changes to be compensated for.

Using a tool, it is possible to open the connection, in that the tip of the second snap-on element is raised over the second catch element by the tool. Thus, a housing closed by the proposed connector may only be opened by destroying the connector or by using a special tool, which means that unauthorized access to the interior of the housing is prevented or is at least detectable.

The closing of the connector is advantageously accompanied by clearly audible clicking due to the restoring movement of the at least one spring element, which means that feedback occurs upon assembly of the housing.

In addition, the proposed connector may easily be produced by injection molding; simple tools not including a slide bar being sufficient.

BRIEF DESCRIPTION OF THE DRAWINGS

An exemplary embodiment of the present invention is illustrated in the figures and explained in greater detail below.

DETAILED DESCRIPTION OF EXAMPLE EMBODIMENTS

Figure 1:
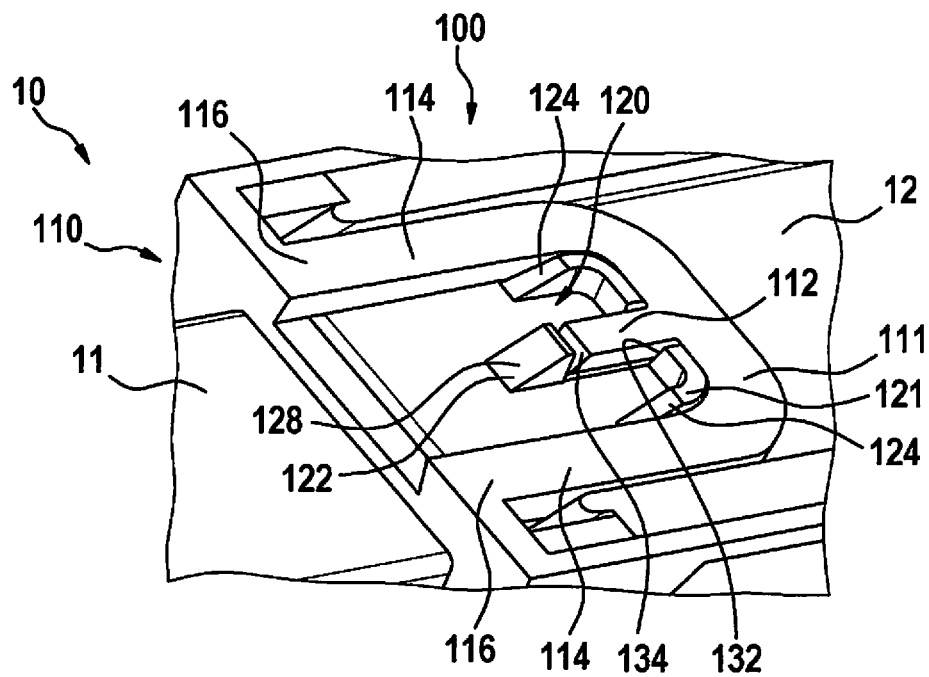
FIG. 1 shows a perspective view of a detail from a housing having a connector.

In the following description of the exemplary embodiments of the present invention, identical components and elements are denoted by the same reference numerals, in which case a repeated description of the components in individual instances is omitted. The figures only depict the subject matter of the present invention schematically.

A detail of a housing 10, which includes a first housing part 11 and a second housing part 12, is represented in FIG. 1. In addition, housing 10 includes a connector 100 having a first connector part 110, which is situated on first housing part 11, and a second connector part 120, which is situated on second housing part 12. In FIG. 1, connector 100 is depicted in the joined state, that is, first housing part 11 and second housing part 12 are joined to each other by connector 100.

First connector part 10 includes two spring elements 114 taking the form of bending beams. In this context, in the non-deflected state depicted, the two spring elements 114 are oriented parallelly to a housing wall 13 of housing 10, see FIG. 3. On one end, the two spring elements 114 lead into a base 116, which is connected to first housing part 11; the two spring elements 114 being constructed in one piece with first housing part 11. At their opposite end, the two spring elements 114 lead into a first snap-on element 111, which therefore interconnects the two spring elements 114 formed as bending beams. First snap-on element 111 is also oriented parallelly to housing wall 13 of housing 10. Starting from the middle of first snap-on element 111, a second snap-on element 112 extends likewise parallelly to housing wall 13 of housing 10, in the direction of first housing part 11. In this context, second snap-on element 112 is formed substantially in the shape of the beam; the beam shape being oriented parallelly to spring elements 114. In this instance, the two spring elements 114, as well as first snap-on element 111 and second snap-on element 112, form a shape, which resembles the capital letter "E," the two spring elements 114 respectively representing the upper and the lower crossbar of the E-shape and second snap-on element 112 representing the middle crossbar of the E-shape. First snap-on element 111 interconnects the three crossbars of the shape.

Second connector part 120 includes a first catch element 121 and a second catch element 122, which are formed in one piece with a section of second housing part 12.

In the joined state of connector 100 represented in FIG. 1, first snap-on element 111 has been slid over first catch element 121, so that first snap-on element 111 abuts first catch element 121 on a side of first catch element 121 facing away from first housing part 11. In this context, first catch element 121 includes an opening 132, with which second snap-on element 112 engages.

In the situation represented in FIG. 1, second snap-on element 112 has been slid over second catch element 122, so that a tip 134 of second catch element 122 faces the side of second catch element 122 facing away form first housing part 11.

First catch element 121 has a first ramp shape 124 on the side facing the base 116 of first connector part 110, and second catch element 122 has a second ramp shape 128 on the side facing base 116 of first connector part 110. When first connector part 110 is brought together with second connector part 120, these ramp shapes 124, 128 allow first snap-on element 111 and second snap-on element 112 to slide over first catch element 121 and second catch element 122, respectively, amid deflection of spring elements 114.

Figure 2:
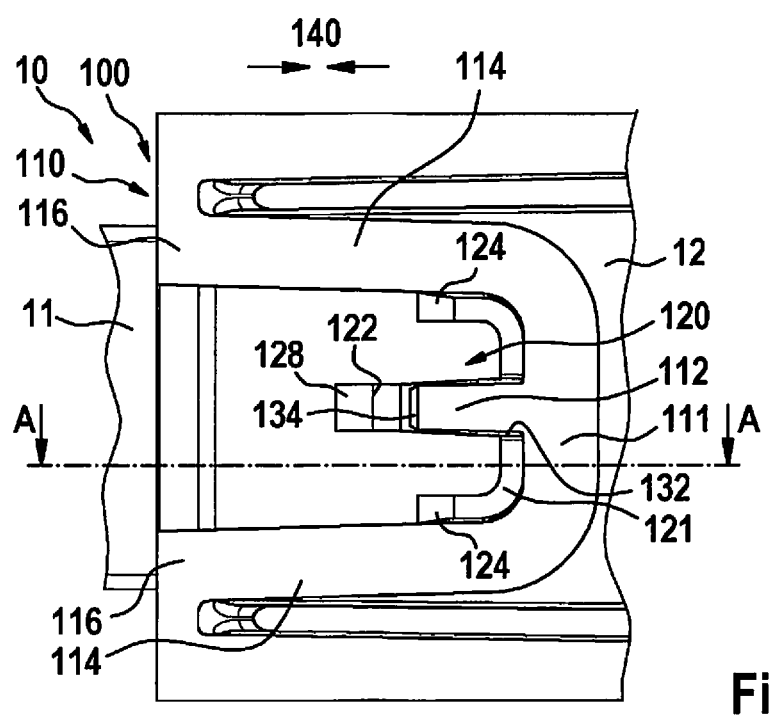
FIG. 2 shows a top view of the connector.

A top view of connector 100 is shown in FIG. 2. In the top view, the E-shape, which is formed by the two spring elements 114, as well as by first snap-on element 111 and second snap-on element 112, is revealed clearly. In addition, it is apparent that with reference to a joining direction 140, tip 134 of second snap-on element 112 faces the side of second catch element 122 facing away from base 116 of first connector part 110. In the joined state, which is depicted in FIG. 2, and in which no external forces act upon connector 100, tip 134 does not touch second catch element 122.

In the joined state represented in FIG. 2, first snap-on element 111 abuts first catch element 121; first catch element 121 being formed in such a manner, that in addition to a force-locked connection between first snap-on element 111 and first catch element 121, a form-locked connection between first catch element 121 and parts of spring elements 114 is also produced.

In FIG. 2, it may also be discerned that first catch element 121 and second catch element 122 have ramp shapes 124, 128, respectively, on their sides facing base 116 of first connector part 110.

Figure 3:
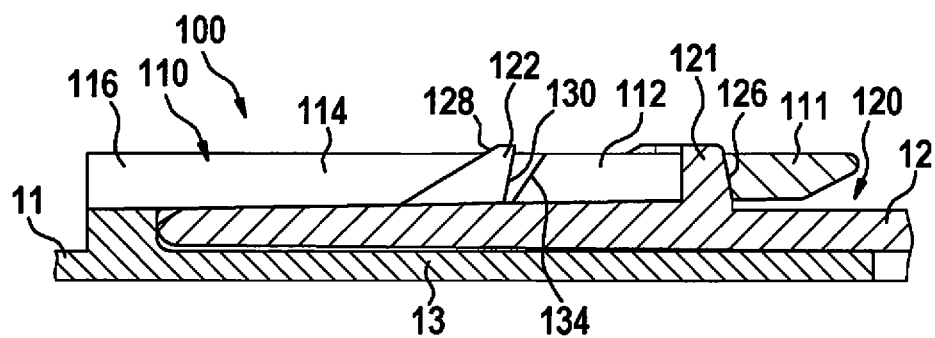
FIG. 3 shows a lateral sectional view of the connector in a joined state.

FIG. 3 shows a lateral sectional view of connector 100, along the section line A-A marked in FIG. 2. In this context, connector 100 is shown in the joined state, in which no external forces act upon connector 100.

In the sectional view in FIG. 3, it is apparent that first connector part 110 includes a spring element 114, which is constructed as a bending beam, runs substantially parallelly to housing wall 13, and is connected to first housing part 11 via base 116. In this context, spring element 114 is spaced apart from housing wall 13, so that second connector part 120 may engage between housing wall 13 and spring element 114. In addition, it is apparent that on the side facing away from base 116 of first connector part 110, first catch element 121 also has a third ramp shape 126, which interacts with a corresponding shape of first snap-on element 111. In this context, first snap-on element 111 is pressed against third ramp shape 126 of first catch element 121 by a restoring force of spring elements 114, so that a force-locked connection is formed.

In the sectional view of FIG. 3, it may also be discerned that second catch element 122 has an undercut 130 on the side facing away from base 116 of first connector part 110, with reference to a direction perpendicular to a plane defined by housing wall 13. Tip 134 of second snap-on element 112 has a shape complementary to undercut 130. In the state of connector 100 shown in FIG. 3, no external forces act upon connector 100, which means that tip 134 does not directly abut undercut 130. A situation, in which an external force acts upon connector 100, is described with reference to FIG. 6.

Figure 4:
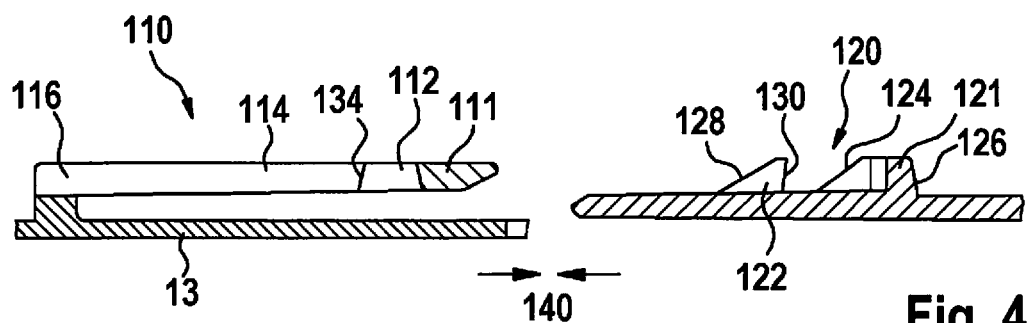
FIG. 4 shows a lateral sectional view of the two connector parts of the connector, prior to the joining.

FIG. 4 shows the connector 100 having first connector part 110 and second connector part 120, prior to the joining. To join first connector part 110 to second connector part 120, the two connector parts 110, 120 are moved towards each other along joining direction 140.

Figure 5:
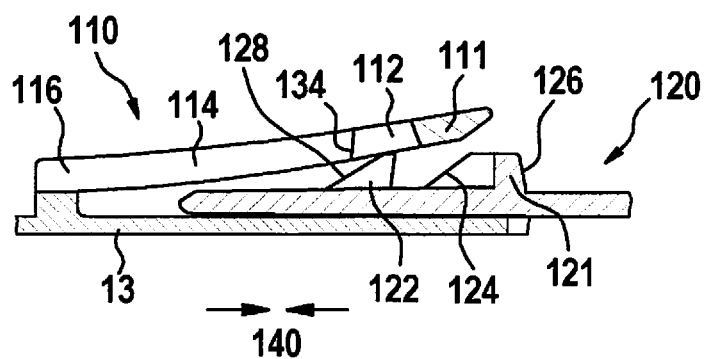
FIG. 5 shows the moving of the two connector parts towards each other.

In FIG. 5, the joining of first connector part 110 to second connector part 120 is depicted schematically. In this context, the two connector parts 110, 120 are moved towards each other along joining direction 140; in the situation represented in FIG. 5, a portion of second connector part 120 is already engaging with a free space between spring element 114 and housing wall 13. In this instance, second snap-on element 112 slides along second ramp shape 128 of second catch element 122; spring element 114 being deflected upwards, that is, away from housing wall 13. As soon as first snap-on element 112 meets first ramp shape 124 of first catch element 121, it slides on first ramp shape 124, in which case a deflection of spring element 114 is brought about. After first connector part 110 and second connector part 120 are pushed together completely, spring element 114 returns again to its original position, due to a restoring force; first snap-on element 111 then abutting third ramp shape 126 of first catch element 121 in a form-locked and force-locked manner, as shown in FIG. 3.

Figure 6:
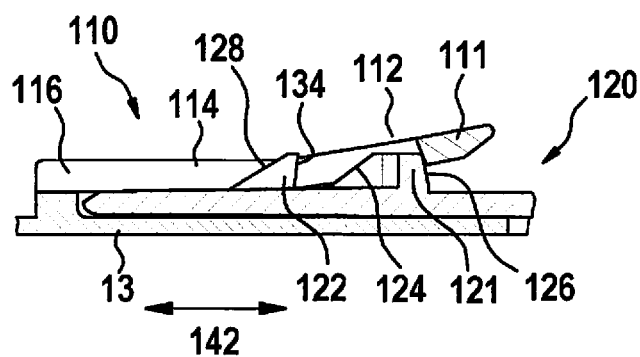
FIG. 6 shows the locking of the connector in response to a movement contrary to the joining direction.

The action of an external force upon connector 100 is depicted in FIG. 6; a movement of the two connector parts 110, 120 contrary to joining direction 140 being produced by the action of the external force. In FIG. 6, this reverse direction is denoted by reference numeral 142. As may be deduced from the view of FIG. 6, in response to the action of a sufficiently powerful external force, the retention force of the force-locked connection between first snap-on element 111 and third ramp shape 126 of first catch element 121 is overcome, which means that first snap-on element 111 slides back up on third ramp shape 126 amid deflection of spring element 114. However, the movement may only occur until tip 134 of second snap-on element 112 abuts undercut 130 of second catch element 122. In this context, undercut 130 prevents an upward movement, that is, away from housing wall 13, which means that a further deflection of spring element 114 is prevented. Thus, separation of first connector part 110 from second connector part 120 is prevented.

Nevertheless, if the two connector parts 110, 120 are intended to be separated from each other, this may be rendered possible in that, using a tool, such as a screwdriver, engagement takes place in the gap between undercut 130 and tip 134, and second snap-on element 112 is raised, that is, moved away from housing wall 13, by the tool. Subsequently, a movement may take place along the reverse direction denoted by reference numeral 142 in FIG. 6; due to being raised by the tool, second snap-on element 112 being guided over second catch element 122.

The present invention is not limited to the exemplary embodiments described here and the aspects emphasized in them. On the contrary, a number of modifications, which lie within the scope of actions undertaken by one skilled in the art, are possible within the area specified by the claims. In this context, in particular, the shapes and the dimensions of spring elements 114, first snap-on element 111, second snap-on element 112, first catch element 121, and second catch element 122 may be selected to deviate from the examples represented in the figures.

What is claimed is:

1. A connector for joining two housing parts, comprising:
a first connector part formed to be situated on a first housing part, the first connector part including at least one spring element and a first snap-on element, the at least one spring element having a base for connection to the first housing part;
a second connector part formed to be situated on a second housing part, the second connector part including a first catch element, and in a joining of the first housing part and the second housing part, the first snap-on element being configured to interact with the first catch element in such a manner, that when the first connector part and the second connector part are moved towards each other along a joining direction, the first snap-on element is slid over the first catch element amid deflection of the at least one spring element, the first catch element and the first snap-on element being subsequently joined in a form-locked and force-locked manner, supported by a restoring force of the at least one spring element;
wherein the first connector part additionally has a second snap-on element, and the second connector part additionally has a second catch element, the second snap-on element and the second catch element being shaped in such a manner, that in response to a movement of the first connector part and the second connector part towards each other, the second snap-on element is slid over the second catch element amid deflection of the at least one spring element; and
wherein the second catch element and the second snap-on element are formed in such a manner, that in response to a movement of the first connector part and the second connector part apart from each other in a direction opposite to the joining direction, a form-locked connection is formed, which prevents the second snap-on element from sliding back over the second catch element,
wherein after the first connector part and the second connector part are joined, the at least one spring element returns to its original position due to the restoring force, wherein the first connector part has two spring elements, the first snap-on element connecting the two spring elements, and the second snap-on element is connected to the first snap-on element, so that the two spring elements, the first snap-on element, and the second snap-on element form an E-shaped configuration.

2. The connector as recited in claim 1, wherein a side of the first catch element pointing in a direction of the base of the first connector part with reference to the joining direction has a first ramp shape, and/or a side of the second catch element pointing in the direction of the base of the first connector part with reference to the joining direction has a second ramp shape, so that during a movement along the joining direction, the first snap-on element slides along on the first ramp shape and the second snap-on element slides along on the second ramp shape, the at least one spring element is deflected.

3. The connector as recited in claim 1, wherein the first catch element has a third ramp shape on a side facing away from the base of the first connector part, and the first snap-on element has a shape complementary to it.

4. The connector as recited in claim 1, wherein the second catch element has a surface perpendicular to the joining direction, on a side facing away from the base of the first connector part, or has an undercut with reference to a direction perpendicular to the joining direction.

5. The connector as recited in claim 4, wherein the second snap-on element includes a tip which has a shape complementary to a shape of a side of the second catch element facing away from the base of the first connector part.

6. The connector as recited in claim 1, wherein each of the two spring elements are in the form of a bending beam.

7. The connector as recited in claim 1, wherein the first catch element has an opening, with which the second snap-on element engages.

8. A housing, comprising:
a first housing part;
a second housing part;
at least one connector, a first connector part of the connector being situated on the first housing part, and a second connector part of the at least one connector being situated on the second housing part, the at least one connector including:
the first connector part formed to be situated on the first housing part, the first connector part including at least one spring element and a first snap-on element, the at least one spring element having a base for connection to the first housing part;
the second connector part formed to be situated on the second housing part, the second connector part including a first catch element, and in a joining of the first housing part and the second housing part, the first snap-on element being configured to interact with the first catch element in such a manner, that when the first connector part and the second connector part are moved towards each other along a joining direction, the first snap-on element is slid over the first catch element amid deflection of the at least one spring element, the first catch element and the first snap-on element being subsequently joined in a form-locked and force-locked manner, supported by a restoring force of the at least one spring element;
wherein the first connector part additionally has a second snap-on element, and the second connector part additionally has a second catch element, the second snap-on element and the second catch element being shaped in such a manner, that in response to a movement of the first connector part and the second connector part towards each other, the second snap-on element is slid over the second catch element amid deflection of the at least one spring element; and
wherein the second catch element and the second snap-on element are formed in such a manner, that in response to a movement of the first connector part and the second connector part apart from each other in a direction opposite to the joining direction, a form-locked connection is formed, which prevents the second snap-on element from sliding back over the second catch element,
wherein after the first connector part and the second connector part are joined, the at least one spring element returns to its original position due to the restoring force, wherein the first connector part has two spring elements, the first snap-on element connecting the two spring elements, and the second snap-on element is connected to the first snap-on element, so that the two spring elements, the first snap-on element, and the second snap-on element form an E-shaped configuration.

9. An ultrasonic sensor, comprising:
a housing including:
a first housing part;
a second housing part;
at least one connector, a first connector part of the connector being situated on the first housing part, and a second connector part of the at least one connector being situated on the second housing part, the at least one connector including:
the first connector part formed to be situated on the first housing part, the first connector part including at least one spring element and a first snap-on element, the at least one spring element having a base for connection to the first housing part;
the second connector part formed to be situated on the second housing part, the second connector part including a first catch element, and in a joining of the first housing part and the second housing part, the first snap-on element being configured to interact with the first catch element in such a manner, that when the first connector part and the second connector part are moved towards each other along a joining direction, the first snap-on element is slid over the first catch element amid deflection of the at least one spring element, the first catch element and the first snap-on element being subsequently joined in a form-locked and force-locked manner, supported by a restoring force of the at least one spring element;
wherein the first connector part additionally has a second snap-on element, and the second connector part additionally has a second catch element, the second snap-on element and the second catch element being shaped in such a manner, that in response to a movement of the first connector part and the second connector part towards each other, the second snap-on element is slid over the second catch element amid deflection of the at least one spring element; and
wherein the second catch element and the second snap-on element are formed in such a manner, that in response to a movement of the first connector part and the second connector part apart from each other in a direction opposite to the joining direction, a form-locked connection is formed, which prevents the second snap-on element from sliding back over the second catch element, wherein after the first connector part and the second connector part are joined, the at least one spring element returns to its original position due to the restoring force, wherein the first connector part has two spring elements, the first snap-on element connecting the two spring elements, and the second snap-on element is connected to the first snap-on element, so that the two spring elements, the first snap-on element, and the second snap-on element form an E-shaped configuration.

* * * * *